United States Patent [19]

Ellenberger et al.

[11] Patent Number: 4,925,024
[45] Date of Patent: May 15, 1990

[54] HERMETIC HIGH FREQUENCY SURFACE MOUNT MICROELECTRONIC PACKAGE

[75] Inventors: John C. Ellenberger; Inbae Yoo, both of Santa Clara; Eugene V. Burdick, Santa Rosa, all of Calif.

[73] Assignee: Hewlett-Packard Company, Palo Alto, Calif.

[21] Appl. No.: 239,018

[22] Filed: Aug. 26, 1988

Related U.S. Application Data

[63] Continuation of Ser. No. 136,465, Dec. 21, 1987, abandoned, which is a continuation of Ser. No. 832,921, Feb. 24, 1986, abandoned.

[51] Int. Cl.$^5$ .............................................. B65D 73/02
[52] U.S. Cl. .................................................. 206/328
[58] Field of Search .............. 206/328, 330, 331, 332, 206/334

[56] References Cited

U.S. PATENT DOCUMENTS 4,470,507  9/1984  Burns ................................. 206/334

FOREIGN PATENT DOCUMENTS 50716  3/1981  Japan .
1191010  7/1982  Japan .
2007911  10/1978  United Kingdom .
2065970  12/1980  United Kingdom .

Primary Examiner—Joseph Man-Fu Moy
Attorney, Agent, or Firm—James M. Williams

[57] ABSTRACT

A hermetic package for microelectronic circuits comprises a ceramic base with conductive, hermetically sealed vias that connect the metal ground plane on the bottom of the base to the circuit on the top, a ceramic frame sealed to the top of the base, leads sealed between the frame and the base, and a lid sealed to the top of the frame. The vias are cofired with the ceramic base and provide good power dissipation because of their thermal conductivity and good RF grounds to isolate different stages in the circuit. Because the vias are hermetically sealed, no separate bottom component and no brazing operation is required to hermetically seal the package. The leads have a tapered section so the leads are wider outside the package reducing inductance and narrower going through the ceramic frame to reduce capacitance, thus tuning the leads to close to 50 ohm impedance. A layer of conducting silver loaded solder glass underneath the lead electrically connects the lead to the circuit and seals the lead to the base. A nonconducting layer of lead oxide solder glass over the lead seals the lead to the ceramic frame. The top surface of the frame has a metallized layer so that the lid can be hermetically sealed to the frame by soldering.

9 Claims, 3 Drawing Sheets

HERMETIC HIGH FREQUENCY SURFACE MOUNT MICROELECTRONIC PACKAGE

This application is a continuation of application Ser. No. 07/136-465, field 12/21/87, now abandoned.

BACKGROUND AND SUMMARY OF THE INVENTION

The invention relates generally to hermetically sealed packages for high frequency microelectronic circuits, and in particular to a high reliability package for microwave hybrid and integrated circuits.

The operating frequency for data processing and data communications circuits is rapidly increasing, from the KHz range to the GHz range. At high frequency, the parasitic capacitance and inductance of the package enclosing the hybrid circuit or IC becomes a major factor, and as a result, the package must be considered a part of the circuit. Also, component densities and heat dissipation requirements are increasing, thus requiring the package to be a good thermal conductor. In these high frequency applications, the package must be compatible with microstrip transmission lines, and surface mount packages are becoming the industry standard. In addition, for analog circuits operating above about 500 MHz, it is very important that the package provide a good RF ground.

Existing packages for microelectronic circuits provide for some but not all of these needs. Traditional chip carriers and ceramic and metal flat packs cannot operate at high frequency, do not provide good RF grounding, and can handle only low power applications. Metal packages, e.g., TO-8 or TO-12 types, are not readily adaptable for housing ICs, cannot be surface mounted, and have a high VSWR at microwave frequencies.

One prior package comes close to meeting all of the criteria required, but due to its parasitic inductance and capacitance, its performance deteriorates at frequencies above 5 GHz. The construction of the package also makes it relatively expensive. A cross sectional view of the construction of this package is shown in FIG. 1. The package comprises a base 11, a lid 13, leads 15 and a ground plane attachment pad 17. The top surface of the base 11 carries thin or thick film circuit elements 19 and components 21. The circuit elements and components are connected to the leads 15 by plated through holes 23 in the base. Other plated through holes, not shown, connect to the ground plane attachment pad 17 to provide an RF ground. The lid is brazed to the top surface of base 11 to make a hermetic seal 25 around the perimeter. The plated through holes, however, still must be sealed to hermetically seal the package. To do this, the leads and ground plane attachment pad must be carefully brazed to the bottom of the base. This requires precise process control and adds to the cost of assembly of the package. In addition, there is no good RF ground plane along the plated through holes so the VSWR of the package becomes high above about 3 GHz. Also, due to the general design of leads 15 and ground plane attachment pad 17, both need to be soldered to the PC board. Because leads 15 are mounted onto the bottom of base 11, the user cannot inspect the package for solder bridging between pad 17 and leads 15 after attachment to the PC board.

An object of the invention is to provide a hermetic package for microelectronic circuits such as microwave frequency ICs and hybrid circuits, which can be surface mounted, has low parasitic capacitance and low inductance to RF ground, lead impedance close to 50 ohms and good power dissipation.

Another object of the invention is to provide a hermetic package for microelectronic circuits that has low piece part and assembly costs and is adapted to automated assembly.

These and other advantages are provided according to the invention by a package comprising a ceramic base with conductive, hermetically sealed vias that connect the metal ground plane on the bottom surface of the base to the circuit on the top, a ceramic frame sealed to the top surface of the base, leads sealed between the frame and the base, and a lid sealed to the top of the frame.

The vias are cofired with the ceramic base and provide good power dissipation because of their thermal conductivity. The vias can be located at any position on the area of the base giving flexibility to the circuit designer by providing good RF grounds for the circuit and can be used to isolate different stages in the circuit and heat sink higher power dissipated components. Because the vias are hermetically sealed, the package is more cost effective. No separate bottom component and no brazing operation is required to hermetically seal the package. Thus, the construction essentially eliminates the "classical" package reducing piece part and assembly costs and eliminating the electrical transition from the package to the circuit.

The leads have a tapered section so the leads are wider outside the package reducing inductance and narrower going through the ceramic frame to reduce capacitance, thus tuning the leads to close to 50 ohm impedance. A layer of conducting silver loaded solder glass underneath the lead electrically connects the lead to the circuit and seals the lead to the base. A nonconducting layer of lead oxide solder glass over the lead hermetically seals the lead between the ceramic frame and the ceramic base. The top surface of the frame has a metallized layer so that the lid can be hermetically sealed to the frame by soldering.

Because the leads extend out of the side of the package, the user can inspect for solder bridging between the package base and the leads after the package has been soldered to the PC board.

This construction overcomes the problems of prior packages to provide a hermetic package which can be surface mounted, has low parasitic inductance to RF ground, 50 ohm lead impedance and good power dissipation.

DETAILED DESCRIPTION OF THE INVENTION

Figure 1:
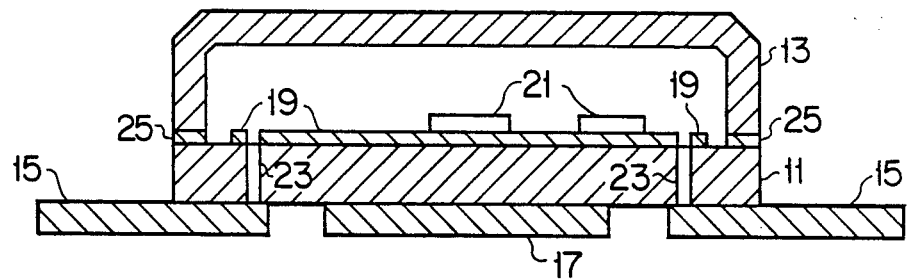
FIG. 1 shows a cross-sectional view of a hermetically sealed microwave IC and hybrid package known in the prior art.
Figure 2:
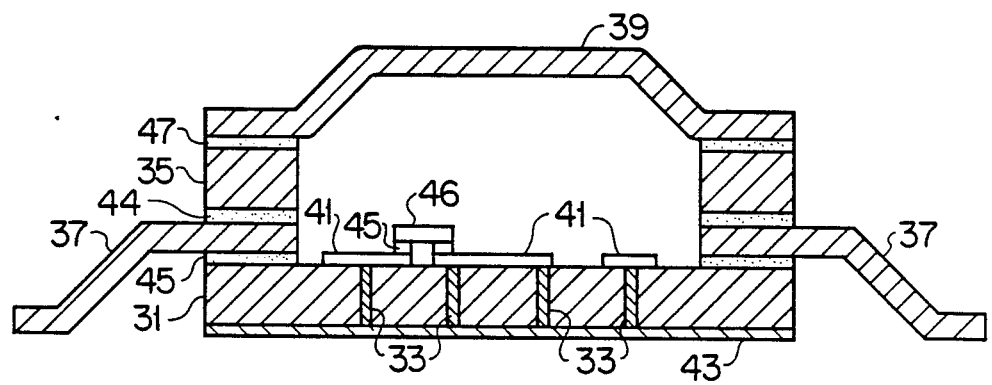
FIG. 2 shows a cross-sectional view of a hermetically sealed microwave IC and hybrid package constructed in accordance with the invention.

The package for microelectronic circuits, shown in FIG. 2, comprises a ceramic base 31 on which the microwave circuit elements and components are mounted, a ceramic frame 35 sealed to the top of the base, conductive leads 37 sealed between the frame and the base for connecting input and output signals to the circuits contained in the package, and a lid 39 sealed to the top of ceramic frame 35. Base 31 has conductive vias 33 which are cofired with the base so that they provide a hermetic seal. The vias provide both RF ground connections and good power dissipation paths for the components and circuit devices.

Ceramic base 31 which forms both the bottom of the package and the substrate for the microcircuitry is made of 96% or 99.5% alumina depending on whether the microcircuitry is thick film or thin film circuitry. The vias 33 are formed in the pre-fired alumina and filled with a tungsten paste. The alumina substrate and tungsten paste are then cofired so that there is a hermetic seal between the insulating alumina and the conducting tungsten filled material. After firing, thin film or thick film circuit elements are coated onto the top of the alumina base. Thin film systems require the 99.5% alumina and are used typically when high circuit densities are required. Thus, the top of the base carries circuit conductor and resistor patterns 41. The bottom of the base is completely metallized, for example, with a tungsten layer or a thin film metal system to provide a ground plane 43 which makes electrical contact with the RF ground plane of the PC board on which the package is mounted.

The conductive vias can be located at any part of the circuit in which the designer requires a good connection to RF ground and thus provide low inductance grounding for the circuit, a convenient means for isolating different stages of the circuit and heat sinking for high power dissipation components. Also, because the vias provide hermetic seals, ceramic base 31 can be used both as the substrate to carry the microcircuit elements and as the hermetic base of the package need for an additional metal sealing component which must be brazed to the base. The combination of the ground plane 43 on the bottom of the base and the conducting vias 33 results in a very low package inductance to ground, allowing the package to be used in high frequency analog and digital applications. Moreover, because the package can be used with thin film metallization circuitry, the frequency range for analog circuits is further extended.

The leads 37 are made of Kovar (ASTM alloy 15) which has the same thermal expansion coefficient as the alumina base 31 and frame 35. To meet the requirements of high reliability standards, the leads are first nickel plated and then gold plated. The gold plating is done selectively, leaving the portion 49 of leads 37 which is inserted into the package between base 31 and frame 35 unplated. This is necessary to achieve a hermetic seal with the lead oxide solder glass around the leads as described later. The leads can be supplied in lead frame form to aid in manufacturability and to make the process of assembly of the package suitable for automation. The leads are formed to the proper shape in the lead frames to provide for surface mount configuration of the package. In this form, they also conveniently provide for alignment of the leads to the substrate by nesting the substrate in the pocket formed by the leads.

Figure 3A:
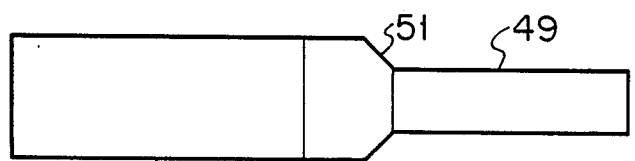
FIG. 3 is a more detailed illustration of one of the leads of the package shown in FIG. 2.
Figure 3B:
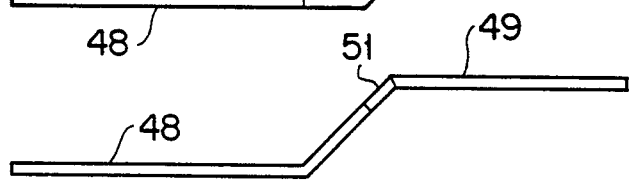

The leads are tapered just at the point where they enter the package in order to provide for a low VSWR at microwave operating frequencies. The taper allows a wider lead outside the package, reducing inductance, and a narrower lead going through the side wall between base 31 and frame 35 to reduce capacitance. FIG. 3 shows details of the shape of a typical lead. The lead 37 has a wide portion 48 and a thin portion 49 which are connected by a tapering section 51. The wide portion 48 is formed to provide a convenient connection from the base to the mounting circuit board for surface mounting. Taper 51 is located just where the lead enters the package. Thin section 49 provides a low capacitance connection through the wall of the package to the circuit elements inside. In one particular example which has been found to work well, the portion 48 is 0.020 inches wide, portion 49 is 0.011 inches wide and the angle of taper 51 is 45 degrees. Using this lead geometry provided a package with a VSWR of 1.2:1 through 5 GHz.

Leads 37 are attached to the contact pads on base 31 with a silver loaded solder glass layer 45 (e.g. JMI 4600 series or equivalent) which assures electrical conductivity as well as a hermetic seal between the leads and the base.

Ceramic frame 35 provides a side wall for the package around the perimeter of base 31. The top surface of frame 35 has a tungsten or molybdenum-manganese layer plated with nickel then gold so that the lid 39 can be soldered on creating a hermetic seal. The bottom of frame 35 is coated with a layer of nonconducting lead oxide solder glass 47 (e.g. T191BF type or equivalent). The lead oxide solder glass forms a non-conducting hermetic seal with the alumina surfaces of frame 35 and base 31 and with the nickel-plated surfaces of leads 37. This seal also provides structural strength for attaching the leads to the package. The top surface of frame 35 also has bond points in each corner so that the metal lid can be grounded, to reduce electromagnetic emissions and shield against interference.

The lid 39 is made of Kovar (ASTM alloy 15) and plated with nickel and gold to meet the requirements of high reliability standards. Here again, Kovar is used because it has the same thermal expansion as the ceramic material of the base and frame. The lids are stamped to form a dome of an appropriate size to house the microcircuit elements.

Figure 4:
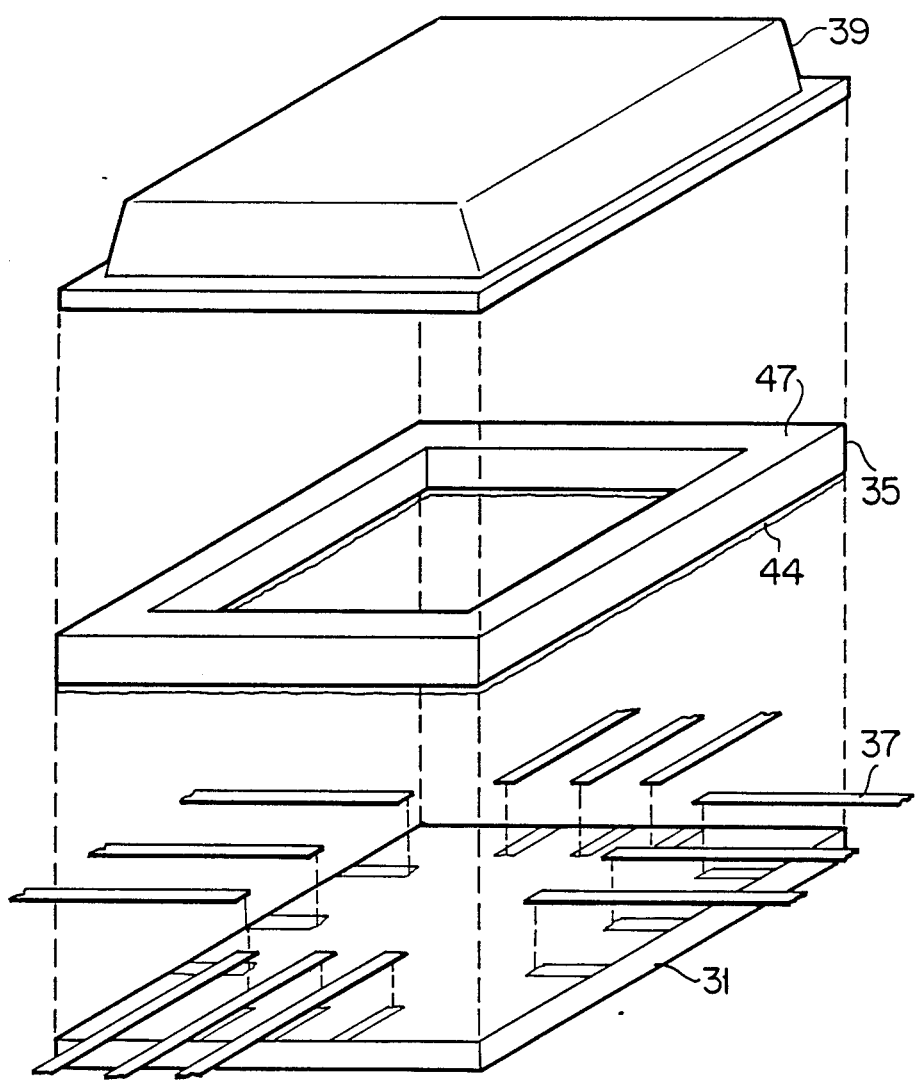
FIG. 4 is an exploded view of the components of the package shown in FIG. 2

The overall construction of the package and the connection of the leads between base 31 and frame 35 can more easily be seen by reference to FIG. 4 which shows an exploded view of the components of the package. FIG. 4 shows how a number of leads 37 (taper and forming not shown) can be attached to the input/output pads of the circuitry on base 31. That lead oxide solder glass layer 45 is applied to the bottom surface of frame 35 before frame 35 is affixed to the top of the base over the leads 37. FIG. 4 also shows how the solderable top surface 47 of frame 35 mates with lid 39 to provide a surface for soldering the lid 39 to the package to form a hermetic seal.

Figure 5:
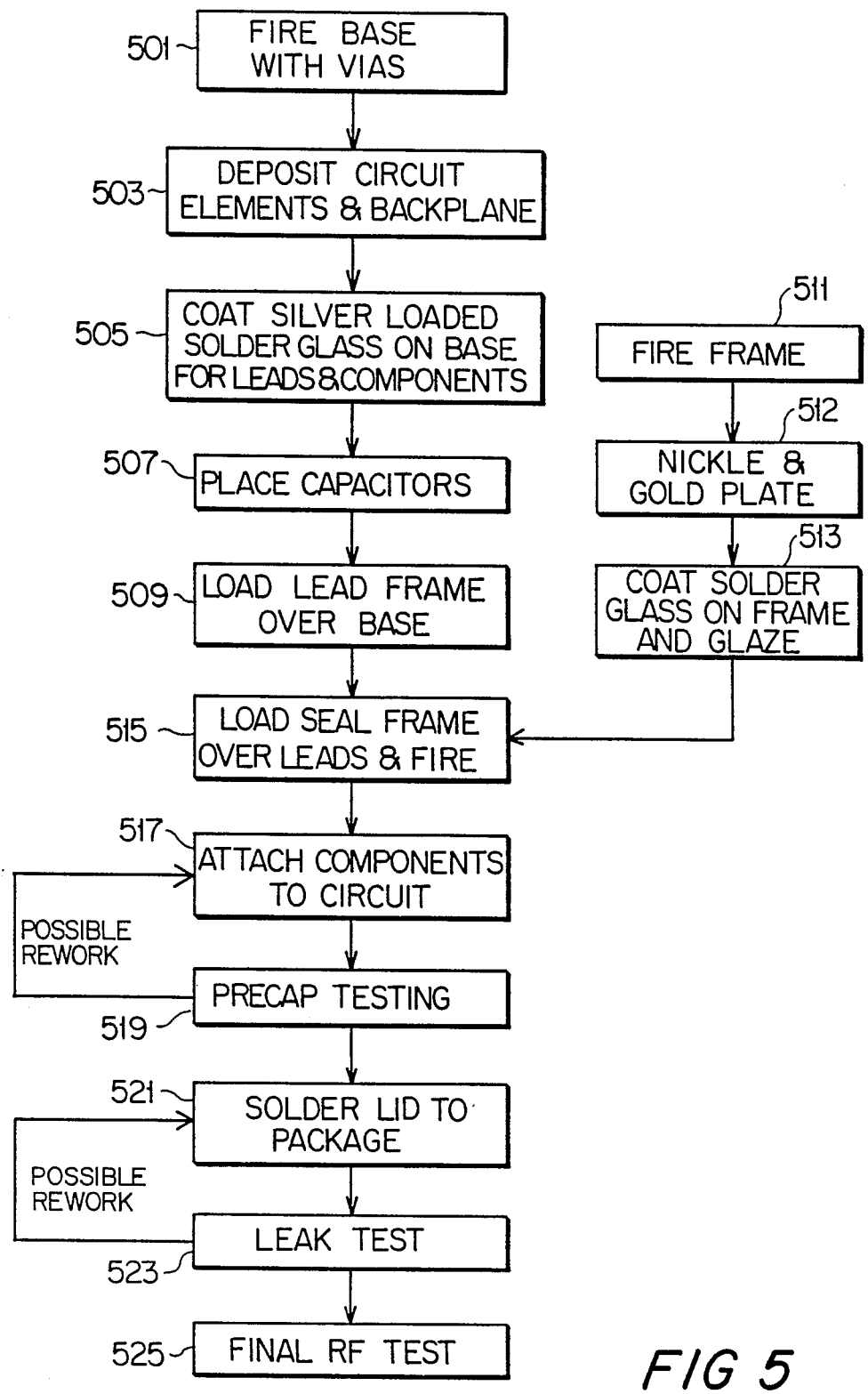
FIG. 5 is a flow chart showing the process steps used for assembly of a package in accordance with the invention.

The process for assembling the package proceeds according the flow chart shown in FIG. 5. First, in step 501, the ceramic base is fired with the conductive tungsten paste vias in place. Next, in step 503, the conductive and resistive circuit elements 41 are deposited on the top surface of the base and the metallized ground-plane 43 is deposited on the bottom surface of the base. Then, in step 505, a selective coating of silver loaded solder glass 45 is coated onto the metallization areas before attachment of the leads 37 and also certain microcircuit components. Only components which can withstand the 420° C. temperatures for firing the solder glass seals can be placed on the circuit at this time. This includes, for example, microwave capacitors, such as capacitor 46 shown in FIG. 2, which are placed on the base in step 507. In step 509, the leads in the form of a lead frame discussed earlier, are placed over the base in alignment with the contact pads on the circuit traces. At this point, the base assembly is ready to be mated with frame 35. The frame 35 is prepared for assembly in steps 511 and 513. First, frame 35 is fired with a top tungsten or molybdenum-manganese layer 47, in step 511. Then the tungsten or molybdenum-manganese is nickel and gold plated, step 512 and finally, the layer of lead oxide solder glass is silk screened onto the bottom surface of the frame and glazed, in step 513. At this point, the frame is ready to be mated with the base over the leads and the entire base and frame assembly is heated to cure the solder glass, step 515. The curing is done by heating the assembly to 420 degrees C. in air for five minutes. This forms a hermetic seal as well as a structural bond for attaching the leads to the package. The lead oxide solder glass is chosen for its combination of strength, low curing temperature and low dielectric constant. The silver loaded solder glass has characteristics very similar to the lead oxide solder glass except it is conductive. So the curing of the solder glass layers can be done in one operation. The relatively low curing temperature does not harm the capacitors placed on the circuit nor does it harm the thin film resistor circuit elements.

At this point, the remaining heat sensitive circuit components can be attached to the circuit traces. This can be done by a variety of suitable methods, including wire bonding. After the components are attached, step 517, testing of the circuit can be done before the lid is attached and sealed. This testing is done in step 519. If necessary, the attachment of components can be reworked if testing finds faulty components or faulty connections. After testing is complete, in step 521, the lid is soldered to the top of the package to provide a total hermetic seal. The soldering is done with gold tin alloy solder in an inert or reducing atmosphere. The low temperature of this process protects the components that cannot withstand the 420° C. curing temperature and provides the interior of the case with a dry inert atmosphere. After soldering, the package is leak tested, in step 523, and reworked if necessary to insure proper hermetic sealing. Finally, in step 525, final RF testing of the circuit is performed.

We claim:

1. A hermetically sealed package for microelectronic circuits comprising:
   a ceramic base having a top surface for holding microelectronic circuit elements and a bottom surface, with hermetically sealed conductive vias extending through the base from the top surface to the bottom surface;
   a plurality of conductive leads attached to circuit elements on the top surface of the base with a conductive heat flowable material that forms a hermetic seal, said leads extending from the sides of the package to provide electrical connections to the circuit in the package;
   a ceramic frame forming the side walls of the package sealed to the top surface of the base and to the leads with a nonconducting heat flowable material that forms a hermetic seal and having a top surface with a metallized layer; and
   a lid having a solderable bottom surface hermetically sealed to the metallized top surface of the frame.

2. The package of claim 1 wherein the conductive vias are formed in the base before the base is fired, filled with a tungsten paste and cofired with the ceramic base.

3. The package of claim 1 wherein the conductive heat flowable material is a silver loaded solder glass, and the nonconducting heat flowable material is a lead oxide solder glass.

4. The package of claim 1 wherein the bottom surface of the base is metallized to provide a ground plane.

5. The package of claim 1 wherein the leads are tapered at the point where they emerge from the package side, with a narrow portion extending between the base and the frame, and a tapered portion formed to make a surface mounting connection with a printed circuit board.

6. A hermetically sealed package for microelectronic circuits comprising:
   a ceramic base having a top surface for holding microelectronic circuit elements and a bottom surface;
   a plurality of conductive leads attached to circuit elements on the top surfaces of the base with a conductive heat flowable material that forms a hermetic seal, said leads extending from the sides of the package to provide electrical connections to the circuit in the package;
   a ceramic frame forming the side walls of the package sealed to the top surface of the base and to the leads with a nonconducting heat flowable material that forms a hermetic seal and having a top surface with a metallized layer; and
   a lid having a solderable bottom surface hermetically sealed to the metallized top surface of the frame.

7. The package of claim 6 wherein the conductive heat flowable material is a silver loaded solder glass, and the nonconducting heat flowable material is a lead oxide solder glass.

8. The package of claim 6 wherein the bottom surface of the base is metallized to provide a ground plane.

9. The package of claim 6 wherein the leads are tapered at the point where they emerge from the package side, with a narrow portion extending between the base and the frame, and a tapered portion formed to make a surface mounting connection with a printed circuit board.

* * * * *